United States Patent [19]

Spalti

[11] 4,361,872
[45] Nov. 30, 1982

[54] MEASURING APPARATUS FOR DETERMINING THE EFFECTIVE VALUE OF THE POWER DEMAND OF AN ENERGY CONSUMER OVER A PERIOD OF CALCULATION

[75] Inventor: Alfred Spalti, Zug, Switzerland

[73] Assignee: LGZ Landis & Gyr Zug AG, Zug, Switzerland

[21] Appl. No.: 158,868

[22] Filed: Jun. 12, 1980

Related U.S. Application Data

[63] Continuation-in-part of Ser. No. 973,623, Dec. 27, 1978, abandoned.

[30] Foreign Application Priority Data

Dec. 29, 1977 [CH] Switzerland .................. 16168/77

[51] Int. Cl.³ .................................................. G06F 15/20
[52] U.S. Cl. .................................. 364/483; 324/76 R
[58] Field of Search ............... 324/142, 103 R, 76 R; 364/483 R, 481

[56] References Cited

U.S. PATENT DOCUMENTS

| | | | |
|---|---|---|---|
| 3,261,037 | 4/1981 | Hicks | 364/483 X |
| 3,517,310 | 6/1970 | Gates et al. | 364/483 X |
| 3,525,042 | 8/1970 | Nunlist et al. | 364/483 X |
| 3,683,343 | 8/1972 | Feldman et al. | 364/483 X |
| 3,775,683 | 11/1973 | Barta et al. | 364/483 X |
| 3,953,795 | 4/1976 | Brunner et al. | 364/483 X |
| 4,006,348 | 2/1977 | Ochial et al. | 364/481 |
| 4,006,415 | 2/1977 | Finger | 364/483 X |
| 4,077,061 | 2/1978 | Johnston et al. | 364/483 |
| 4,080,568 | 3/1978 | Funk | 364/464 X |
| 4,120,031 | 10/1978 | Kincheloe et al. | 364/483 X |
| 4,218,736 | 8/1980 | Haraguchi | 364/483 |
| 4,218,737 | 8/1980 | Buscher et al. | 364/483 X |
| 4,240,149 | 12/1980 | Fletcher et al. | 364/483 |

FOREIGN PATENT DOCUMENTS 1360318 7/1974 United Kingdom ............... 364/483

Primary Examiner—Edward J. Wise
Attorney, Agent, or Firm—Morgan, Finnegan, Pine, Foley & Lee

[57] ABSTRACT

In a measuring apparatus for determining the effective value of the power demand of an energy consumer over a period of calculation, a pulse generator 4 associated with a consumption meter 3 produces fixed quantity pulses. A measuring and calculating means 6 forms measurement values which are proportional to the reciprocal of the time intervals between the fixed quantity pulses and which are summed in a summing means 7. An evaluation means 9, which is in communication with the summing means 7 by way of a communication channel 8, forms the effective value $P_{eff}$ from the sum of the measurement values. The measuring and calculating means 6 may comprise a microprocessor.

4 Claims, 3 Drawing Figures

MEASURING APPARATUS FOR DETERMINING THE EFFECTIVE VALUE OF THE POWER DEMAND OF AN ENERGY CONSUMER OVER A PERIOD OF CALCULATION

CROSS-REFERENCE TO RELATED APPLICATION

This application is a continuation-in-part to the earlier application, Ser. No. 973,623, filed Dec. 27, 1978, now abandoned.

BACKGROUND OF THE INVENTION

1. Field of the Invention

This invention relates to measuring apparatus for determining the effective value of the power demand of an energy consumer over a period of calculation.

2. Description of the Prior Art

The suppliers of electrical energy endeavor to encourage the energy consumers to keep to a power demand which is constant with time. They therefore use tariffs which are composed of a portion which is dependent upon the energy taken, and a portion which is dependent upon the power.

It has been found that the effective value, or mean square value, of the power is highly suitable as a tariff value for determining the power-dependent portion.

The effective value $Y_{eff}$ or mean square value of a time-dependent parameter y is known to be defined as:

$$Y_{eff} = \sqrt{\frac{1}{T} \int_0^T y^2(t)\, dt}$$

wherein T denotes the integration period and t denotes time.

For purposes of determining the effective value of the power demand of an energy consumer, the power may be continuously measured with a power measuring transducer, a signal which is proportional to the square of the power may be formed with a squaring means, the time integral of said signal may be formed with a capacitor, and finally the effective value of the power may be calculated from the time integral, in accordance with the formula set out above.

However, only if the effective value is determined over a comparatively short period of calculation can such a method supply measurement results which are of a satisfactory degree of accuracy

SUMMARY OF THE INVENTION

According to the present invention there is provided a measuring apparatus for determining the effective value of the power of an energy consumer over a period of calculation. The apparatus comprises: a pulse generator associated with a consumption meter for producing fixed quantity pulses each of which represents the consumption of a predetermined fixed quantity of energy; a measuring and calculating unit connected to the pulse generator for forming measurement values which are proportional to the reciprocal of the time intervals between the individual fixed quantity pulses; a summing means for summing the measurement values; and an evaluation means for forming the effective value $P_{eff}$ of the power in accordance with the relationship;

$$P_{eff} = \sqrt{\frac{E_o}{T} \cdot Z}$$

wherein $E_o$ denotes the fixed quantity of energy, T denotes the duration of the period of calculation, and Z denotes the sum of the measurement values.

Embodiments of the invention provide a measuring apparatus for determining the effective value of the power, which is simple and which is also distinguished by a high degree of measuring accuracy even when the effective value is determined over a very long period of calculation, for example over a period of a month or a year.

BRIEF DESCRIPTION OF THE DRAWING

The invention will now be described by way of example with reference to the accompanying drawing, in which.

DESCRIPTION OF PREFERRED EMBODIMENT

Figure 1:
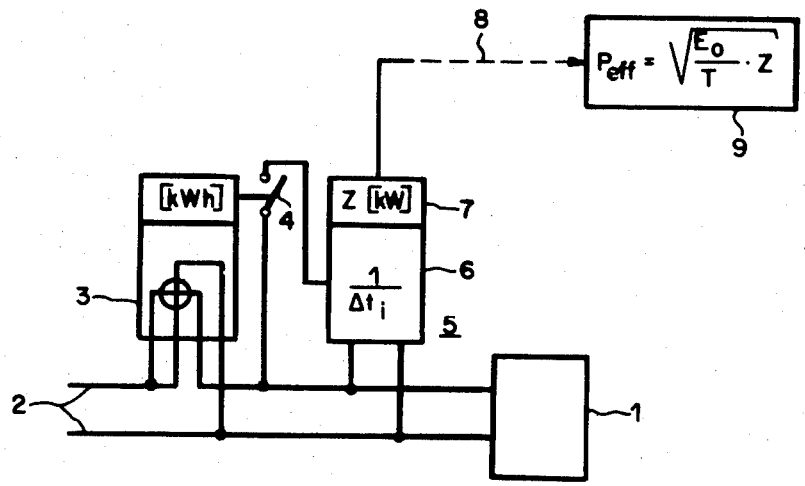
FIG. 1 is a basic diagram illustrating the principle of a measuring apparatus.

Referring to FIG. 1, a consumer 1 draws electrical energy from an energy distribution network 2. This energy is measured with an electricity meter 3. The counting mechanism of the electricity meter 3 is connected to a pulse generator 4 which produces a fixed quantity pulse whenever a given fixed quantity of energy, for example a Kilowatt-hour, is consumed. The fixed quantity pulses control a device 5 which may be structurally combined with the electricity meter 3 and which comprises a measuring and calculating unit 6 and a summing unit 7. The summing unit 7 is advantageously a counting mechanism which is calibrated in kilowatts, and is referred to hereinafter as the summing counting mechanism.

Whenever a fixed quantity pulse appears, the measuring and calculating unit 6 forms a measurement value which is proportional to the reciprocal of the time interval between this fixed quantity pulse and the preceding fixed quantity pulse. These measurement values are summed in the summing counting mechanism 7. The measuring and calculating unit 6 preferably comprises a microprocessor which determines the time interval between each two consecutive fixed quantity pulses, by comparison with the network frequency of the energy distribution network 2, which serves as a time base, and calculates the reciprocal of said time interval. The calculated reciprocal can be fed to a storage means whose storage content is discharged in fixed blocks and introduced into the summing counting mechanism 7. It will be appreciated that the above-mentioned storage means can also be omitted, and the summing counting mechanism 7 can be advanced after each fixed quantity pulse by an amount corresponding to the reciprocal.

The summing counting mechanism 7 of the device 5 is in communication with an evaluation unit 9 by way of a communication channel 8. The communication channel 8 may comprise a known counter condition transmission means which transmits the counter condition at the end of the period of calculation by way of the energy distribution network 2 or by way of a separate line, or the communication channel 8 may also comprise another suitable communication connection.

Figure 2:
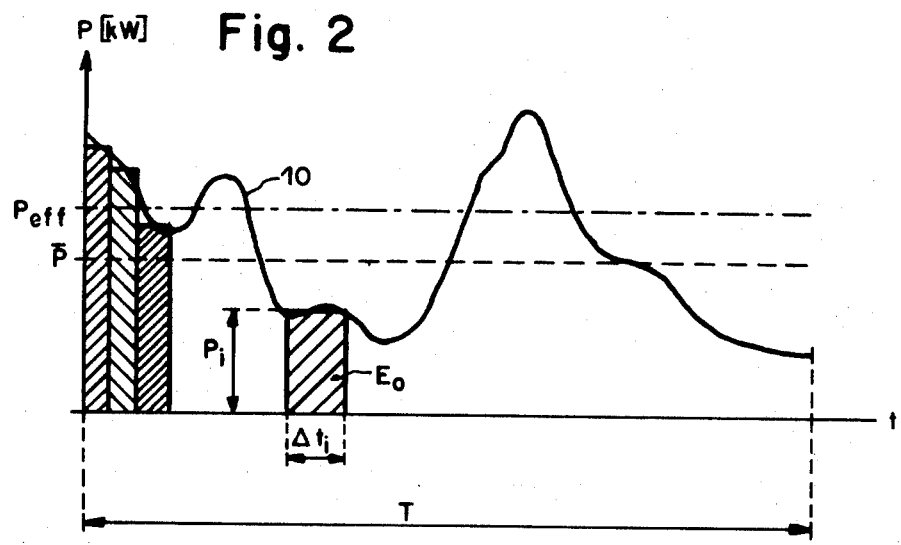
FIG. 2 is a power-time graph.

Referring to FIG. 2, reference 10 denotes a load curve which represents what happens with respect to the power P as a function of time t over a prolonged period of calculation T. The hatched areas denote fixed quantities of energy $E_o$ which are taken by the consumer 1 at time intervals $\Delta t_i$. The mean power within a time interval $\Delta t_i$ is indicated by $P_i$.

The following relationship applies:

$$P_i = \frac{E_o}{\Delta t_i}$$

Hereinafter, the difference between the counting mechanism conditions of the summing counting mechanism 7 at the end and at the beginning of the calculation period T is referred to as the measurement value A. This measurement value Z corresponds to the accumulated values of the power $P_i$ averaged over the time intervals $\Delta t_i$.

$$Z = \sum_i P_i$$

In the evaluation means 9, the value $$\sqrt{\frac{E_o}{T} \cdot Z}$$

is formed from the measurement value Z. The value formed in the evaluation means 9 corresponds to the effective value $P_{eff}$ of the power P, because the following applies:

$$Z = \sum_i P_i = \sum_i \frac{E_o}{t_i} = \frac{1}{E_o} \sum_i \left(\frac{E_o}{\Delta t_i}\right)^2$$

and thus:

$$\sqrt{\frac{E_o}{T} \cdot Z} \approx \sqrt{\frac{1}{T} \int_0^T P^2(t) \cdot dt} = P_{eff}$$

If a fixed quantity of energy $E_o$ of 1 kilowatt-hour, a monthly consumption E of 500 Kilowatt-hours and a calculation period T of one month are taken as an example, the measurement value Z is formed by 500 increments. The replacement of this total by the integral is therefore ensured in practice with a sufficient degree of accuracy.

The amount K which is to be paid for the energy E taken can be determined for example in accordance with the formula:

$$K = a \cdot E + b \cdot T \cdot P_{eff} = a \cdot E \left(1 + \frac{b}{a} \cdot \frac{P_{eff}}{P}\right)$$

wherein a and b denote proportionality factors and P denotes the arithmetic mean value of the power.

In accordance with an increasing value of:

$$\frac{P_{eff}}{P} = K_F$$

wherein $K_F$ denotes the form factor of the load curve 10. The form factor $K_F$ is equal to one if the consumer takes energy at constant power. In practice, the form factor $K_F$ is always higher than 1.

Figure 3:
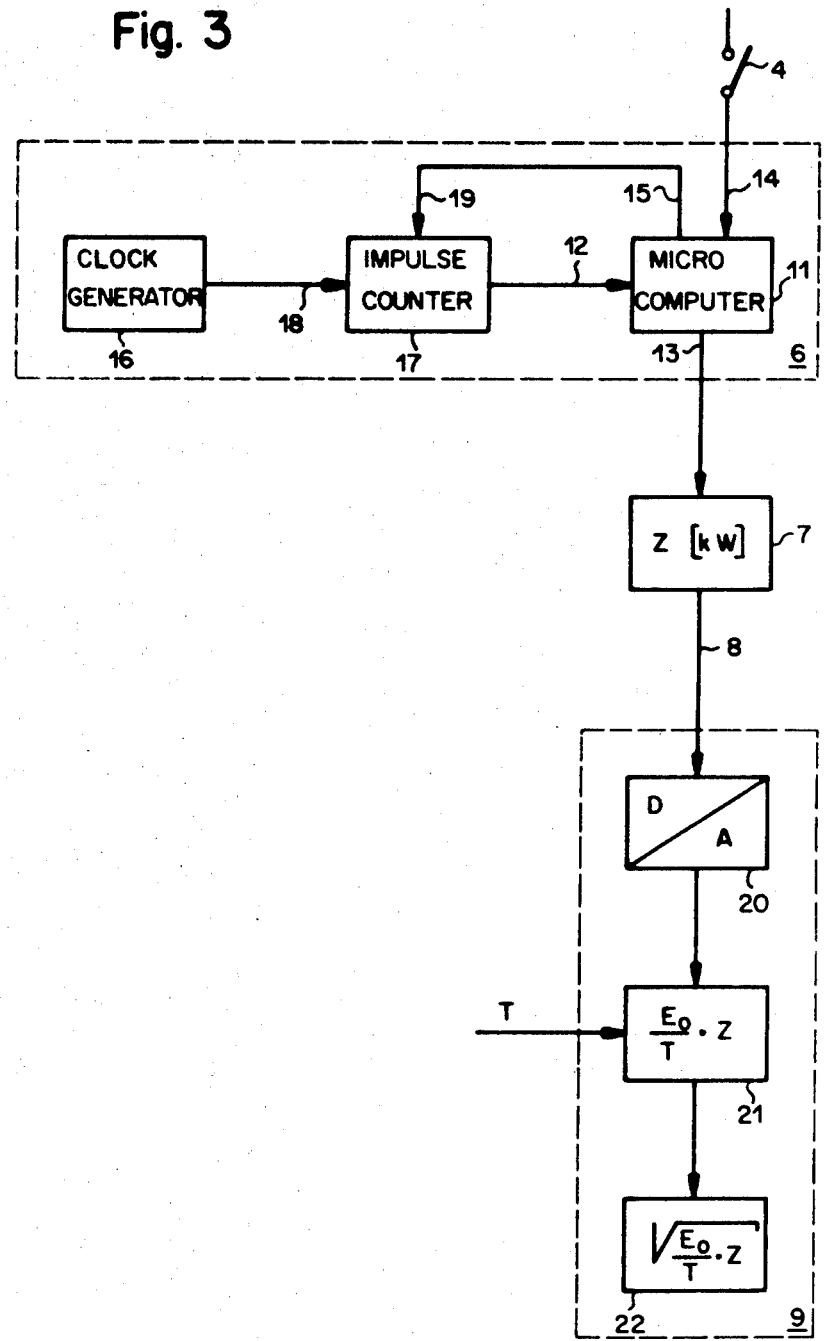
FIG. 3 is a more detailed diagram of some of the components of the apparatus illustrated in FIG. 1.

The measuring and calculating unit 6, the summing unit 7 and the evaluation unit 9 are each assembled using standard computing elements known in the art. These elements can be either digital computing elements or analog computing elements or a combination of analog and digital. One specific such combination is illustrated in FIG. 3.

Calibration unit 6 is made up of a clock generator 16, an impulse counter 17 and a micro computer 11, programmed to calculate reciprocals. The micro computer includes a control input 14, a control output 15, a data input 12 and a data output 13. Control output 15 is connected to a reset input 19 of counter 17. The counter receives pulses from clock generator 16 via an input 18. The clock generator produces pulses at constant frequency, for example, at the line frequency rate or a multiple thereof. The switch 4 associated with the watt-hour meter is connected to control input 14.

A control pulse created by momentary closure of switch 4 causes micro computer 11 to read the output count of impulse counter 17 and to calculate the reciprocal which appears on data output 13. The micro computer also provides a control signal to input 19 of the counter to reset the counter so it begins a new counting cycle. Thus, each time switch 4 is actuated, the micro computer provides a digital output indication which is the reciprocal of the number of pulses from clock generator 16 that have occurred since the prior actuation of the switch.

The reciprocal can be calculated, for example, by sequential substration as described "SGS-ATS F8 Guide to Programming," page 10-1 to 10-5 or by other commonly used procedures.

Summing unit 7 is a conventional digital summing circuit the adds successive outputs from micro computer 11 to maintain a running total.

The evaluation unit 9, which calculates the value $$P_{eff} = \sqrt{\frac{E_o}{T} \cdot Z},$$

can be constructed using digital components.

In practice T is normally a constant (e.g., one month) and $E_o$ is likewise a constant. Therefore, $P_{eff}$ is porportional to the square root of Z and can therefore be obtained from extracting the square root. This could easily be done by a suitably programmed micro computer.

Another arrangement for evaluation unit 9 in which analog computing elements are utilized is shown in FIG. 3. The components include a digital to analog converter 20, a divider 21 and a root extractor 22.

The digital to analog converter 20 converts the digital output signal of summing unit 7 to an analog signal which is supplied to one input of divider 21. The value T is supplied to the other input of the divider. The quotient from divider 21 is supplied to the root extraction circuit 22 which in turn provides the square root.

The analog divider and analog root extractor are known in the art as for example described in the book "Halbelieter-Schaltung-Stechnik. Semi-Conductor Technology" by U. Tietze and Ch. Schenk, Springer Verlig 1971 pages 299, 300 Chapter 11.16.7.

While only a few illustrative embodiments have been described in detail, it should be apparent that there are other embodiments within the scope of this invention.

What is claimed is:

1. A measuring apparatus for determining the effective value of the power of an energy consumer over a period of calculation, the apparatus comprising; a pulse generator associated with a consumption meter, for producing fixed quantity pulses each of which represents the consumption of a predetermined fixed quantity of energy; a measuring and calculating means connected to the pulse generator, for forming measurement values which are proportional to the reciprocal of the time intervals between the individual fixed quantity pulses; a summing means for summing the measurement values; and an evaluation means for forming the effective value $P_{eff}$ of the power in accordance with the relationship:

$$P_{eff} = \sqrt{\frac{E_o}{T} \cdot Z}$$

wherein $E_o$ denotes the fixed quantity of energy, T denotes the duration of the period of calculation, and Z denotes the sum of the measurement values.

2. Apparatus according to claim 1 wherein the summing means is a counting mechanism which is in communication with the evaluation means by way of a communication channel.

3. Apparatus according to claim 2 wherein the measuring and calculating means comprises a microprocessor.

4. Apparatus according to claim 1 wherein the measuring and calculating means comprises a microprocessor.

* * * * *